(12) United States Patent
Colvin (10) Patent No.: US 9,465,049 B2
(45) Date of Patent: Oct. 11, 2016

(54) APPARATUS AND METHOD FOR ELECTRONIC SAMPLE PREPARATION

(71) Applicant: James B. Colvin, Newark, CA (US)

(72) Inventor: James B. Colvin, Newark, CA (US)

(*) Notice: Subject to any disclaimer, the term of this patent is extended or adjusted under 35 U.S.C. 154(b) by 254 days.

(21) Appl. No.: 13/859,902

(22) Filed: Apr. 10, 2013

(65) Prior Publication Data

US 2013/0271169 A1 Oct. 17, 2013

Related U.S. Application Data

(60) Provisional application No. 61/686,871, filed on Apr. 13, 2012, provisional application No. 61/686,872, filed on Apr. 13, 2012, provisional application No. 61/741,423, filed on Jul. 18, 2012.

(51) Int. Cl.
*G01R 1/44* (2006.01)
*H01L 21/66* (2006.01)
*B23C 3/00* (2006.01)
*B24B 37/013* (2012.01)
*G01R 31/28* (2006.01)

(52) U.S. Cl.
CPC . *G01R 1/44* (2013.01); *B23C 3/00* (2013.01); *B24B 37/013* (2013.01); *G01R 31/2898* (2013.01); *H01L 22/12* (2013.01); *H01L 22/26* (2013.01); *H01L 2224/32145* (2013.01); *H01L 2224/32225* (2013.01); *H01L 2224/45147* (2013.01); *H01L 2224/48091* (2013.01); *H01L 2224/48227* (2013.01); *H01L 2224/73265* (2013.01); *H01L 2924/0002* (2013.01); *H01L 2924/1461* (2013.01); *H01L 2924/15311* (2013.01); *Y10T 409/303864* (2015.01)

(58) Field of Classification Search
None
See application file for complete search history.

(56) References Cited

U.S. PATENT DOCUMENTS

| 3,640,807 | A | | 2/1972 | Van Dijk | |
|---|---|---|---|---|---|
| 3,774,078 | A | * | 11/1973 | Martin | H05K 7/20509 174/16.3 |
| 3,828,606 | A | * | 8/1974 | Wolter | G01N 25/72 374/102 |
| 4,857,133 | A | * | 8/1989 | Mullen | B23K 3/00 156/378 |
| 4,921,564 | A | * | 5/1990 | Moore | H01L 21/67132 156/701 |
| 5,144,747 | A | * | 9/1992 | Eichelberger | H01L 21/67121 257/700 |
| 5,337,015 | A | * | 8/1994 | Lustig | B24B 37/013 156/345.13 |
| 5,393,288 | A | * | 2/1995 | Miyasaka | B23Q 17/2233 409/132 |

(Continued)

OTHER PUBLICATIONS

USPTO, Restriction Requirement, U.S. Appl. No. 13/861,981, Mar. 25, 2014, 8 pgs.

(Continued)

*Primary Examiner* — Jermele M Hollington
*Assistant Examiner* — Suresh K Rajaputra
(74) *Attorney, Agent, or Firm* — The Danamraj Law Group, P.C.

(57) ABSTRACT

A method and apparatus for preparing electronic samples for a subsequent treatment, e.g., application of a failure analysis treatment. In one embodiment, an electronic device is mounted on a thermally controlled plate and a select temperature is applied thereto. While maintaining the select temperature applied to the thermally controlled plate, a sample preparation process is performed on the electronic device, such as, e.g., performing polishing, thinning, milling, lapping or extracting one or more semiconductor dies that form the electronic device.

20 Claims, 6 Drawing Sheets

(56) References Cited

U.S. PATENT DOCUMENTS

| | | | | |
|---|---|---|---|---|
| 5,444,637 | A | 8/1995 | Smesny et al. | |
| 5,461,774 | A * | 10/1995 | Holmes | H01L 21/4878 174/16.3 |
| 5,504,434 | A * | 4/1996 | Schepis | H01L 21/485 257/E21.526 |
| 5,532,612 | A * | 7/1996 | Liang | G01R 31/2886 324/750.05 |
| 5,948,217 | A * | 9/1999 | Winer | B24B 37/013 204/192.33 |
| 5,990,022 | A * | 11/1999 | Motoura | H01L 22/34 257/E21.525 |
| 5,990,549 | A * | 11/1999 | Chiu | H01L 23/367 257/678 |
| 6,020,264 | A * | 2/2000 | Lustig | B24B 37/013 156/345.13 |
| 6,107,606 | A * | 8/2000 | Hotchkiss | H01L 21/56 219/411 |
| 6,144,104 | A * | 11/2000 | Baker | H01L 23/3736 257/783 |
| 6,303,396 | B1 * | 10/2001 | Ring | G01R 31/2898 250/559.27 |
| 6,356,097 | B1 * | 3/2002 | Loewenhardt | B24B 31/013 257/E21.528 |
| 6,504,242 | B1 * | 1/2003 | Deppisch | H01L 23/3736 257/706 |
| 6,724,078 | B1 * | 4/2004 | Sur | H01L 23/42 257/675 |
| 6,809,423 | B1 * | 10/2004 | Mithal | H01L 23/16 257/687 |
| 6,975,028 | B1 * | 12/2005 | Wayburn | F28D 15/0266 257/712 |
| 7,017,358 | B2 * | 3/2006 | Wayburn | G01R 31/2891 165/80.4 |
| 7,019,368 | B1 * | 3/2006 | McCollum | H01L 27/0266 257/355 |
| 7,122,908 | B2 * | 10/2006 | Jiang | H01L 23/49816 257/783 |
| 7,427,554 | B2 * | 9/2008 | Henley | H01L 21/76251 257/18 |
| 7,432,729 | B2 * | 10/2008 | Noel | G01R 31/2874 324/750.05 |
| 7,585,693 | B2 * | 9/2009 | Frutschy | H01L 24/81 257/747 |
| D612,815 | S * | 3/2010 | Desorbo | D13/173 |
| 8,604,603 | B2 * | 12/2013 | Lau | H01L 23/055 257/686 |
| 8,741,394 | B2 * | 6/2014 | Haverkamp | C23C 16/24 427/534 |
| 8,877,552 | B2 * | 11/2014 | Sri-Jayantha | A47J 37/1219 257/712 |
| 2003/0057885 | A1 * | 3/2003 | Segi | H01L 23/36 315/291 |
| 2003/0077478 | A1 * | 4/2003 | Dani | H01L 23/3737 428/673 |
| 2003/0087459 | A1 * | 5/2003 | Laursen | B24B 37/013 438/8 |
| 2003/0173051 | A1 * | 9/2003 | Rinella | B22D 17/007 164/113 |
| 2003/0224555 | A1 * | 12/2003 | Shiozawa | H05K 3/0097 438/108 |
| 2004/0151629 | A1 * | 8/2004 | Pease | B01L 3/5027 422/68.1 |
| 2004/0217092 | A1 * | 11/2004 | Demers | G02B 7/00 219/117.1 |
| 2004/0264009 | A1 * | 12/2004 | Hwang | F25B 21/02 359/820 |
| 2005/0018402 | A1 * | 1/2005 | Oman | H01L 23/4338 361/709 |
| 2005/0067178 | A1 * | 3/2005 | Pearson | H01L 23/10 174/548 |
| 2005/0098195 | A1 * | 5/2005 | Jackson | B08B 3/02 134/6 |
| 2005/0260775 | A1 * | 11/2005 | DiBattista | H01L 22/26 438/4 |
| 2006/0142971 | A1 * | 6/2006 | Reich | G01C 17/00 702/150 |
| 2006/0241891 | A1 * | 10/2006 | Kaushal | H01L 21/67248 702/136 |
| 2006/0292740 | A1 * | 12/2006 | Applebaum | H01L 21/56 438/106 |
| 2007/0142976 | A1 * | 6/2007 | Tezuka | G05D 23/19 700/300 |
| 2008/0080591 | A1 * | 4/2008 | Tanaka | G01K 7/052 374/179 |
| 2008/0128160 | A1 * | 6/2008 | Suh | H05K 3/3436 174/260 |
| 2008/0134689 | A1 * | 6/2008 | Shen | F25B 21/02 62/3.7 |
| 2008/0290889 | A1 * | 11/2008 | Hillard | G01R 31/2648 324/755.11 |
| 2009/0014871 | A1 * | 1/2009 | Meyer | B81C 1/00301 257/737 |
| 2009/0067131 | A1 * | 3/2009 | Yasuda | H01L 23/4093 361/707 |
| 2009/0286382 | A1 * | 11/2009 | Huff | C23F 4/00 438/455 |
| 2010/0086004 | A1 * | 4/2010 | Dellar | F27B 5/04 374/14 |
| 2010/0133256 | A1 * | 6/2010 | Bandoh | H01L 21/67103 219/444.1 |
| 2010/0149756 | A1 * | 6/2010 | Rowcliffe | H01L 23/10 361/714 |
| 2010/0176824 | A1 * | 7/2010 | Makihara | G01R 27/2617 324/690 |
| 2010/0210041 | A1 * | 8/2010 | Chang | H01L 21/67248 438/8 |
| 2011/0043239 | A1 * | 2/2011 | Tomita | G01R 1/0735 324/756.03 |
| 2011/0189925 | A1 * | 8/2011 | Iravani | B24B 37/013 451/5 |
| 2011/0236594 | A1 * | 9/2011 | Haverkamp | C23C 16/24 427/553 |
| 2013/0273671 | A1 * | 10/2013 | Colvin | G01R 1/44 438/14 |
| 2013/0273674 | A1 * | 10/2013 | Colvin | G01R 1/44 438/17 |

OTHER PUBLICATIONS

USPTO, Restriction Requirement, U.S. Appl. No. 13/861,926, Apr. 1, 2014, 8 pgs.

Circuit Net, "What is the Proper DI Water Resistivity," www.circuitnet.com, Jun. 2009, 2 pgs, available at http://www.circuitnet.com/experts/59891.shtml.

D. Scott et al., "Global Die UltraThin Silicon for Backside Diagnostics and Circuit Edit," ISTFA 2009 Proceedings, Nov. 2009, pp. 110-118.

J. Colvin & K. Jarausch, "Atomic Force Microscopy: Modes and Analytical Techniques with Scanning Probe Microscopy," Microelectronics Failure Analysis Desk Reference, 6th ed. 2011, pp. 536-546.

J. Colvin, "BGA and advanced Package Wire to Wire Bonding for Backside Emission Microscopy," ISTFA 1999 Proceedings, Nov. 1999, pp. 365-374.

J. Colvin, "FemtoFarad/TeraOhm Endpoint Detection for Microsurgery of Integrated Circuit Devices," ISTFA 2012 Proceedings, Nov. 2012, pp. 30-38.

J. Colvin, H.Patel & T. Hazeldine, "Stress Reduction during Silicon Thinning Using Thermal Relaxation and 3d Curvature Correction Techniques," ISTFA 2012 Proceedings, Nov. 2012, pp. 478-484.

Lion Precision, Capacitive Sensor Operation and Optimization, Nov. 2012, 13 pgs, available at lionprecision.com.

M. Mulholland & R. P. Wadell, "A Method of Stress Reduction during Silicon Thinning," ISTFA 2011 Proceedings, Nov. 2011, pp. 424-427.

MTI Instruments, Capacitance Measurement Products, Sep. 2011, 8 pgs, available at http://mtiinstruments.com/technology/Capacitance.aspx.

R. Desplats et al., "3D Backside Sample Preparation for Radiation Tsting," in Proc. European Space Components Conf. ESCCON 2002, 2002, pp. 1-9.

(56) References Cited

OTHER PUBLICATIONS

T. Lundquist et al., "Ultra-Thinning of C4 Integrated Circuits for Backside Analysis during First Silicon Debug," 2001, 5 pgs, Pergamon.

Ultra Tec Manufacturing, Inc., ASAP-1 IPS, Selected Area Decapsulation, Substrate Thinning, & Polishing, www.Ultratecusa.com, Nov. 2010, 4 pgs.

Ultra Tec Manufacturing, Inc., PLASER, Plasma Final Decapsulation Unit for Plastic IC Packages, Sep. 2010, 2 pgs, available at http://www.ultratecusa.com/plaser.

William H. Hayt, Jr., "Engineering Circuit Analysis," McGraw-Hill 3rd ed. 1971, pp. 146.

William H. Hayt, Jr., "Engineering Electromagnetics," McGraw-Hill, 4th ed. 1981, p. 163.

W. Mack, 3-D SiP Devices: 3-D System in Package—How to Cope with Increasing Challenges, EDFA AO (2012) pp. 4-11, 2012.

USPTO, Office Action, U.S. Appl. No. 13/861,981, Jul. 9, 2014, 21 pgs.

USPTO, Office Action, U.S. Appl. No. 13/861,926, Jul. 15, 2014, 23 pgs.

USPTO, Notice of Allowance and Fee(s) Due, U.S. Appl. No. 13/861,926, Jan. 9, 2015, 10 pgs.

USPTO, Applicant-Initiated Interview Summary, U.S. Appl. No. 13/861,981, Oct. 23, 2014, 3 pgs.

USPTO, Office Action, U.S. Appl. No. 13/861,981, Jan. 16, 2015, 12 pgs.

USPTO, Notice of Allowance, U.S. Appl. No. 13/861,981, Jun. 4, 2015, 13 pgs.

\* cited by examiner

APPARATUS AND METHOD FOR ELECTRONIC SAMPLE PREPARATION

PRIORITY UNDER 35 U.S.C. §119(e) & 37 C.F.R. §1.78

This nonprovisional application claims priority based upon the following prior U.S. provisional patent applications entitled: (i) "TEMPERATURE CONTROLLED STRESS REDUCTION FOR MICROMACHINING SEMICONDUCTOR DEVICES," Application No. 61/686,871, filed Apr. 13, 2012, in the name(s) of James Barry Colvin; (ii) "CAPACITIVE AND RESISTIVE ENDPOINT DETECTION FOR MICROMILLING AND POLISHING," Application No. 61/686,872, filed Apr. 13, 2012, in the name(s) of James Barry Colvin; and (iii) "CAPACITIVE AND RESISTIVE ENDPOINT DETECTION FOR MICROMILLING AND POLISHING I," Application No. 61/741,423, filed Jul. 18, 2012, in the name(s) of James Barry Colvin; each of which is hereby incorporated by reference in its entirety for all purposes.

CROSS-REFERENCE TO RELATED APPLICATION(S)

This application discloses subject matter related to the subject matter disclosed in the following commonly owned U.S. patent application(s): (i) "APPARATUS AND METHOD FOR ENDPOINT DETECTION DURING ELECTRONIC SAMPLE PREPARATION," U.S. patent application Ser. No. 13/861,926, filed Apr. 12, 2013, in the name(s) of James Barry Colvin, now U.S. Pat. No. 9,034,667; and (ii) "APPARATUS AND METHOD FOR ENDPOINT DETECTION DURING ELECTRONIC SAMPLE PREPARATION," U.S. patent application Ser. No. 13/861,981, filed Apr. 12, 2013, in the name(s) of James Barry Colvin; each of which is hereby incorporated by reference in its entirety.

BACKGROUND OF THE DISCLOSURE

1. Technical Field

The present disclosure generally relates to techniques for preparing electronic samples that may be used in, e.g., failure analysis of electronic devices such as semiconductor dies, chips, integrated circuits, packages, boards, and the like. More particularly, and not by way of any limitation, the present disclosure is directed to an apparatus and method for electronic sample preparation using temperature-controlled stress reduction.

2. Description of Related Art

Sample preparation is often required in the field of semiconductor failure analysis. For example, backside thinning and polishing may be necessary for validation techniques such as Focused Ion Beam (FIB) circuit editing and optical probing using Photon Emission or Laser stimulus methods. Conventional sample preparation techniques continue to encounter various challenges, however, especially as new packages involving ever larger semiconductor dies with are being introduced. Methods such as flat lapping are typically relegated to "time and look" procedures that allow no way to interactively check the endpoints of preparation in a sample semiconductor die. In addition, the issue of die breakage or cracking during sample preparation has also become significant.

BRIEF DESCRIPTION OF THE DRAWINGS

The accompanying drawings are incorporated into and form a part of the specification to illustrate one or more exemplary embodiments of the present disclosure. At least one drawing figure comprises a black and white photomicrograph or photocopy thereof of an Infra Red (IR) interference fringe pattern taken using an IR microscope on an electronic sample prepared according to the teachings of the present patent application. Applicant submits that the black and white photomicrographs are the only practicable medium for illustrating the IR interference fringe patterns in a meaningful fashion. See 37 CFR 1.84(b)(1). Various advantages and features of the disclosure will be understood from the following Detailed Description taken in connection with the appended claims and with reference to the attached drawing figures in which:

DETAILED DESCRIPTION OF THE DRAWINGS

In general, the present disclosure involves applying energy, e.g., heat, to an example electronic device whereby any die bow, curvature, warpage or other non-planar surface conditions associated with one or more semiconductor dies forming part of the example electronic device may be mitigated. Such mitigation can be helpful in the subsequent processing of the example electronic device because of the relaxation of the constituent components of the example electronic device, whereby the internal stress or strain created in the semiconductor dies during the device's manufacturing or assembly flow are advantageously reduced. Accordingly, the semiconductor die(s) of the example electronic device may be rendered more amenable for subsequent treatments, e.g., including preparation of the sample dies for one or more of failure analysis techniques, without compromising the integrity of the die(s), e.g., mechanical breakage, chipping, cracking, delamination, etc. of the die itself as well as without compromising any electrical contact structures such as bonding wires, pads, and the like. Sample preparation processes such as, e.g., grinding, polishing, thinning, milling, lapping and/or extracting one or more semiconductor dies that form the electronic device, may therefore be advantageously performed with higher reliability, which processes would have otherwise yielded compromised samples in conventional techniques.

In one aspect, the present disclosure is directed to an embodiment of a method that comprises the following operations or acts: mounting an electronic device on a thermally controlled plate; applying a select temperature to the thermally controlled plate; and while maintaining the select temperature applied to the thermally controlled plate, performing a sample preparation process, step or operation on the electronic device. In one variation, the method may include compensating for the electronic device's curvature based on a 3D model of the electronic device's surface while performing the sample preparation process under thermal relaxation of the electronic device.

In a further aspect, the present disclosure is directed to an embodiment of an apparatus, comprising: a thermally controlled plate adapted for supporting an electronic device thereon; a controller for maintaining a select temperature applied to the thermally controlled plate; and a spindle head for rotating a chuck about a Z-axis that is substantially perpendicular to the thermally controlled plate, wherein the chuck may be adapted for housing a machining tool configured to perform a sample preparation process, step or operation on the electronic device. In a further variation, the apparatus may include means for compensating for the electronic device's curvature based on a 3D model of the electronic device's surface while performing the sample preparation process.

Figure 1A:
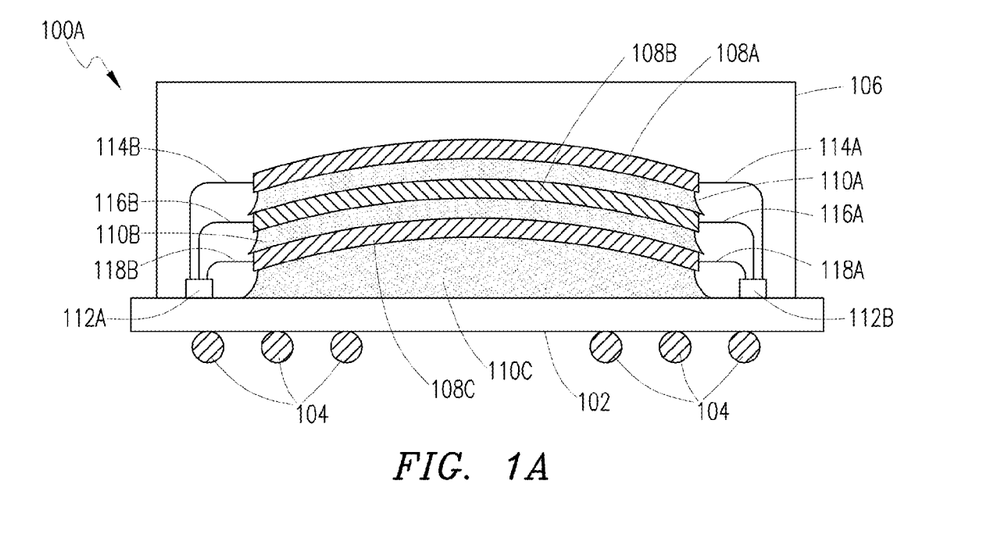
FIG. 1A depicts an example electronic device that may be used for sample preparation in accordance with an embodiment of the present disclosure.

Embodiments of the disclosure will now be described with reference to various examples of how the embodiments can be made and used. Like reference numerals are used throughout the description and several views of the drawings to indicate like or corresponding parts, wherein the various elements are not necessarily drawn to scale. FIG. 1A depicts an example electronic device 100A that may be used for sample preparation in accordance with an embodiment of the present disclosure. Broadly, the example electronic device 100A may comprise a device including one or more semiconductor dies that are packaged using one or more materials (e.g., underfill, encapsulation, interposer, etc.) wherein semiconductor dices and the materials have dissimilar thermo-mechanical properties, e.g., including different coefficients of expansion such as linear, area or volumetric expansion coefficients. By way of illustration, such an example electronic device 100A may comprise various types of ball grid array (BGA) devices, flip-chip or Controlled Collapse Chip Connection (C4) devices, multi-chip module (MCM) devices, chip scale package (CSP) devices, chip stack devices, etc. that include one or more semiconductor dies having either the same or different functionalities. Example semiconductor dies may be formed of materials such as silicon, germanium, gallium arsenide, indium-based compounds, etc., and may comprise any known or heretofore unknown digital and/or analog devices such as static RAMs (SRAMs), dynamic RAMs (DRAMs), programmable ROMs (PROMs), Flash memories, digital signal processing (DSP) device, RF integrated circuits, microelectromechanical system (MEMS) devices, microprocessors or microcontrollers, system-on-chip (SOC) devices, etc.

As illustrated in FIG. 1A, the example electronic device 100A includes a packaging substrate 102 (e.g., ceramic and/or polymeric substrates) having a number of contact structures, pads, solder balls, etc., collectively labeled by reference numeral 104, for providing electromechanical contact and coupling with external circuitry. Reference numeral 106 is illustrative of an encapsulation mold or glob top packaging that encloses one or more semiconductor dies or chips 108A-108C that may be stacked together using suitable interposers, die attach layers, underfill layers, etc. By way of illustration, reference numerals 110A through 110C exemplify such inter-die layers and an attachment layer between the die 108C and the substrate 102. One or more conductive posts 112A, 112B, having a suitable electrical conductive relationship with the external contacts 104, may be provided as part of the example electronic device 100A for providing electrical connectivity between the various semiconductor dies 108A-108C and the external contacts 104 via a plurality of bond wires 114A-118A and 114B-118B.

Due to the dissimilar thermo-mechanical properties of the constituent components of the example electronic device 100A, temperature profiles encountered during any stage of the manufacture/assembly of the example electronic device 100A can have a significant effect on the levels of mechanical strain/stress present in the semiconductor chips of the device 100A. For instance, various encapsulating, underfilling and die attach steps required in an example device 100A may use liquid or film thermosetting resins, epoxys, adhesives, or other polymeric materials. Typically, curing such materials can take a long time, adding to the overall product cycle times. In such scenarios, techniques such as "snap cure" may be employed (e.g., curing at higher temperatures using injection molding techniques) to reduce the cure times—and concomitantly the product cycle times—associated with the example electronic device 100A. Generally, the term "snap cure" may be defined as the ability to cure within 60 seconds of exposure to heat. Depending on the cure method used (i.e., effectiveness of heat transfer) the cure time can be even shorter than 10 seconds (i.e., spot curing). After snap/spot curing at higher temperatures, the electronic device 100A is brought back to normal, or ambient, temperatures, resulting in warpage and other symptoms of non-planarity of the semiconductor dies due to the dissimilar properties of the constituent materials. As a consequence, the semiconductor dies are under a mechanical/structural loading of various stresses and strains in normal operating conditions.

Figure 1B:
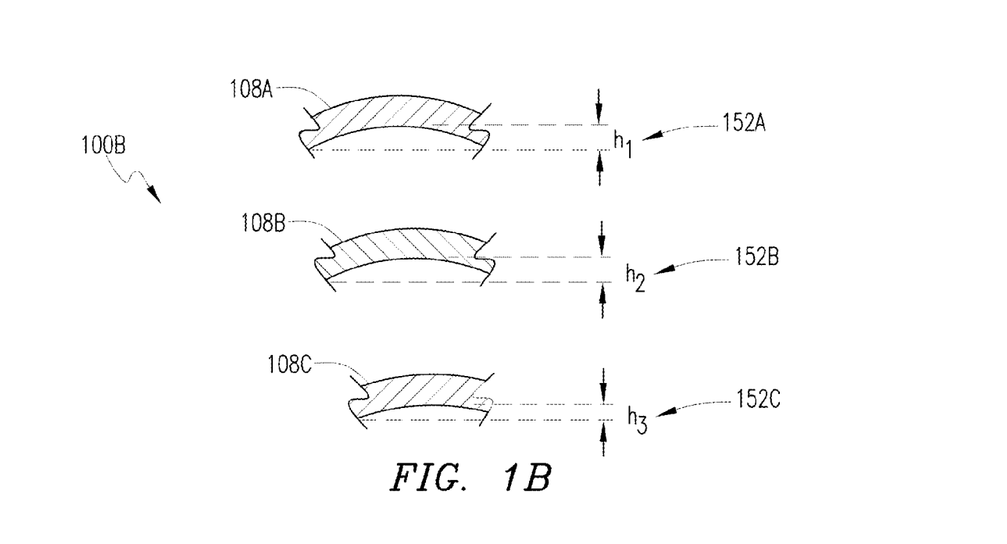
FIG. 1B illustrates a representation of a portion of the example electronic device that highlights die bow or curvature or other non-planar surface conditions as a result of common manufacturing flows associated with the example electronic device.

FIG. 1B illustrates a representation of a portion 100B of the example electronic device 100A that highlights die bow or curvature (i.e., warpage) or other non-planar surface conditions as a result of common manufacturing flows associated with the example electronic device 100A. It will be apparent to one skilled in that art that the die warpage shown in FIG. 1B is purely illustrative and is not drawn to scale. Accordingly, only the warpage in the example semiconductor dies 108A-108C is highlighted without presenting any details relative to the inter-die layers etc. In general, the semiconductor dies 108A-108C show a convex curvature relative to the substrate, i.e., bow towards the substrate of the package. The semiconductor dies 108A-108C may exhibit varying degrees of radius of curvature because the dies may be formed of different semiconductor materials and may therefore possess dissimilar thermal properties. Typically, the surface planarity may be measured as a center-to-edge height by traversing a drop-down tool from the center of the die to one or more edges, which in the current scales of integration can be over 10 mm or so. By way of illustration, reference numeral 152A refers to a die bow ($h_1$) associated with the semiconductor die 108A, reference numeral 152B refers to a die bow ($h_2$) associated with the semiconductor die 108B and reference numeral 152C refers to a die bow ($h_3$) associated with the semiconductor die 108C. It should be appreciated that a die bow of over 40 microns (μm) or so can be present in some of the example electronic devices currently available, which can exert a considerable stress not only on the die having the curvature but also on the other dies in the stack as well. Further, when such example devices are to be prepared as a sample or device under test (DUT) for a failure analysis (FA) technique, e.g., backside thinning or polishing for electron microscopy, FIB analysis, backside emission microscopy and the like or removal of a particular die from the stack for additional preparation, not only do the preparation processes yield uneven samples (due to the non-planar conditions) but more severely the semiconductor dies are susceptible to mechanical damage due to the interaction of the "built-in" stress and the applied forces during such sample preparation operations.

Figure 2:
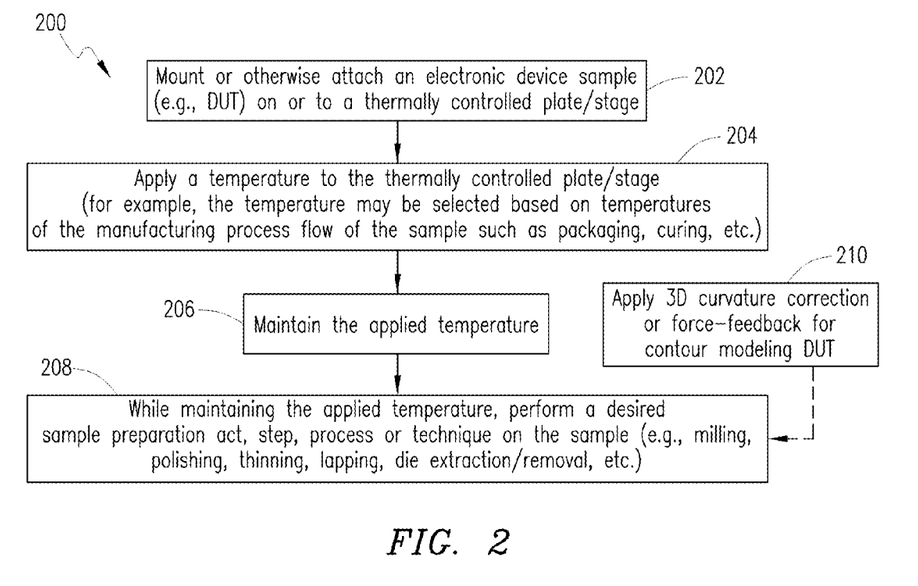
FIG. 2 illustrates a flowchart of a method for preparing an electronic sample according to an embodiment of the present disclosure.

FIG. 2 illustrates a flowchart of a method 200 for preparing an electronic sample according to an embodiment of the present disclosure. At block 202, an example electronic device, sample or DUT is mounted to or on a thermally controlled plate or stage of a sample preparation apparatus. A select temperature is applied to the thermally controlled plate or stage (block 204). For example, the temperature may be selected based on the temperatures of the manufacturing process flow of the electronic device (e.g., snap cure temperatures during packaging). If the highest temperature at which the electronic device was cured during packaging is $T_H°$ C., the applied temperature may be selected as $T_H°$ C. The applied temperature may then be maintained using appropriate feedback control (block 206). While maintaining the applied temperature, whereby the example electronic device is placed in a thermally relaxed condition, a desired sample preparation process, act, operation, step, or technique is performed on the electronic device using any suitable machining tool adapted for grinding, thinning, polishing, milling, etc. (block 208). It will be apparent that such sample preparation processes are dependent on the intended use of the sample and/or the type(s) of FA techniques in which the sample might be used.

It is possible that in some electronic devices thermal relaxation alone may not be able to create a sufficiently planar sample part during sample preparation (e.g., thinning, grinding, milling, and/or polishing operations and the like). Such a situation may arise due to the dynamic nature of the package in which the device is packaged (i.e., the packaging material itself can exhibit thermal warpage properties) as well as the curvature that may be caused by the sample preparation action. To address this issue, a 3D modeling and curvature correction technique may be used in conjunction with the thermal relaxation method described above. As the packaged part's surface can be modeled as a portion of a sphere having a radius R (e.g., as an R.sup.2 function) based on any suitable curve-fitting or regression technique, a contour model of the part's surface curvature may be obtained by taking a number of measurements using a drop-down tool that is traversed from the center of the part to one or more edges of the part. Such a model may then be used to initialize the position of the machining tool (may be provided as part of a computer-numerical control or CNC-based machining apparatus) such that the 3D curvature of the part may be followed during sample preparation under thermally relaxed conditions. Since the surface can be changing dynamically during the machining process, the modeling can be done dynamically or at select points in time or iteratively in order to adjust the machine tool's position at different points during the preparation. In another variation, a desired sample preparation technique may be applied first to a select endpoint/depth, and a 3D curvature correction technique may then be used to vary the positioning of the machining tool and/or the stage on which the electronic sample is mounted so that the sample may be better planarized. In a still further variation, a number of known curvatures for different packages/parts (fabricated using specific processes) may be maintained in a memory that can be used to adjust the machining tool and/or the DUT stage so as to compensate or otherwise account for the curvature in addition to thermally relaxing the DUT during sample preparation. Reference numeral 210 in FIG. 2 refers to a multi-functional block wherein appropriate 3D curvature correction may be applied, optionally in some embodiments, in conjunction with applying thermal relaxation during a sample preparation. Additional details regarding the 3D curvature modeling may be found in the paper titled "Stress Reduction during Silicon Thinning Using Thermal Relaxation and 3D Curvature Correction Techniques", ISTFA 2012 Proceedings, pp. 478-484 (2012), co-authored by the inventor of the instant patent application, which is hereby incorporated by reference herein. Additional details regarding endpoint detection may be found in the following commonly owned co-pending U.S. patent application(s): (i) "APPARATUS AND METHOD FOR ENDPOINT DETECTION DURING ELECTRONIC SAMPLE PREPARATION," U.S. patent application Ser. No. 13/861,926, filed Apr. 12, 2013, in the name(s) of James Barry Colvin; and (ii) "APPARATUS AND METHOD FOR ENDPOINT DETECTION DURING ELECTRONIC SAMPLE PREPARATION," U.S. patent application Ser. No. 13/861,981, filed Apr. 12, 2013, in the name(s) of James Barry Colvin; cross-referenced hereinabove and hereby incorporated by reference herein.

Figure 3A:
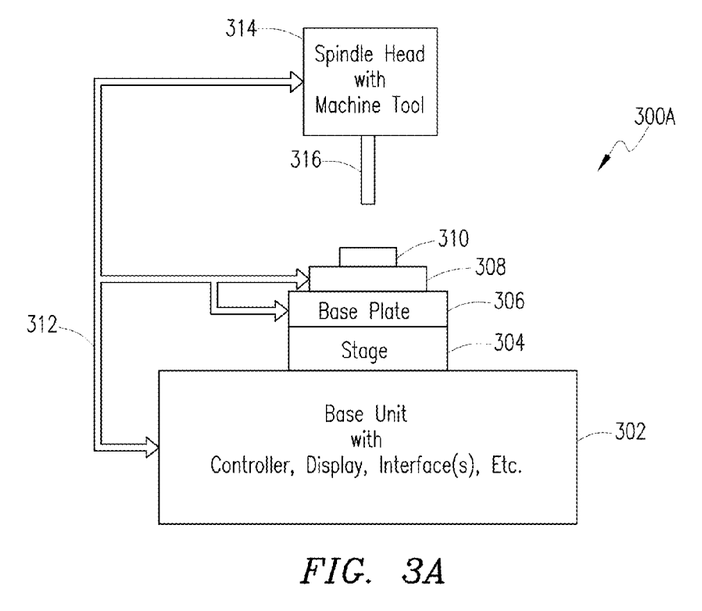
FIG. 3A illustrates a simplified block diagram of an apparatus configured for electronic sample preparation using thermal relaxation techniques and/or 3D curvature correction according to an embodiment of the present disclosure.

FIG. 3A illustrates a simplified block diagram of an apparatus 300A configured for electronic sample preparation using thermal relaxation and/or 3D curvature correction techniques according to an embodiment of the present disclosure. Reference numeral 302 refers to a main/base unit that is adapted to house a feedback controller as well as a power supply, in addition to a suitable display having one or more graphic user interfaces (GUI). An X-Y stage 304 is adapted to move in both X and Y directions, and may be substantially horizontal (i.e., planar) and/or may be tilted in some angle around either X-axis or Y-axis, depending on the application. A grounded base plate 306 and a thermally controlled hot/cool plate 308 form a thermal control system operating under the feedback controller for providing thermal energy to an example electronic device 310. In one example implementation, thermal control is provided by means of a Peltier-controlled plate wherein one or more sensors (not illustrated) may be used to monitor temperature at the thermal plate 308 and the associated base plate 306. As is known, the Peltier effect creates a heat flux between the junction of two dissimilar materials, and the effect may be used to create a solid-state active heat pump that transfers heat from one side of the device to the other, depending on the direction of the current. That is, the Peltier heat pump may be used to heat the example electronic device 310 to a select temperature, maintain the temperature to thermally relax it, and after performing a select sample preparation process thereon, also cool the device to ambient temperatures, all in situ. When used in the cooling mode, appropriate coolants may be used in connection with the Peltier pump.

To support a broader range of temperatures, a stack of Peltier elements may be applied. In one implementation, a pair of Peltier elements may be coupled in a stack to provide a temperature range of 0° C. to 130° C. Reference numeral 314 refers to a spindle head adapted for rotating a chuck about the Z-axis that is substantially perpendicular to the X-Y plane defined by the example device 310, thermal plate 308 and base plate 306, all supported on the X-Y stage 306. The chuck may be configured to house and hold a machining tool 316 that is adapted for a particular type of sample preparation process. For example, the machining tool 316 may comprise a diamond-tipped milling tool of 3 mm or 5 mm diameter for selective removal of material. Likewise, suitable polishing and lapping tools may be fitted as part of the sample preparation apparatus 300A depending on the type of the desired operation. Where micromachining techniques such as milling, grinding, polishing, lapping, etc. are used, suitable lubricants (e.g., water, diamond paste, colloidal silica, and the like) may also be provided.

Suitable cabling or other electrical connection means 312 (including internal cabling, external cabling, or both, and involving wired means or wireless means) may be provided for coupling the power supply, Peltier sensor feedback and the spindle head (e.g., for controlling loading force, tilting of the spindle speed to follow a curved surface for 3D correction, etc.) with the controller/processor provided as part of the base unit 302. Although not specifically shown in FIG. 3A, a camera with laser attachment may also be provided for monitoring tool tip placement and for spot targeting. In one implementation, such a camera arrangement may be provided at an angle (e.g., 45°) relative to the X-Y plane of the apparatus 300A. Appropriate input/output interfaces, ports, network cards, etc. may also be provided as part of the base unit 302 for coupling the apparatus 300A to a variety of external devices such as computers, printers, recording devices such as video recorders/monitors, cameras, microscopes, as well as WiFi hotspots, etc.

As alluded to previously, thermal control may be provided under any suitable feedback control mechanism driven by the controller of the base unit 302. For example, the Peltier sensors may be driven by a Proportional-Integral-Derivative (PID) controller. An H-bridge may be used to drive a motor in one direction or in the opposite direction, thereby changing the polarity of the current applied to the Peltier elements. Accordingly, either a "Heating" mode or a "Cooling" mode may be set or reset based on an operator input or automatically. The power supply may be based on an adjustable Buck regulator design, but it can also be any type of an adjustable linear regulator. A pulse-width modulation (PWM) waveform may be adjusted by the processor based on at least a portion of the PID feedback from the thermal sensors coupled to the thermal plate 308 and/or the base plate 306. For instance, an overheat sensor may be provided to monitor the base plate 306, whereby excess heat may be conducted off the base plate 306 using conduction to the base unit 302 of the apparatus 300A or by means of liquid cooling.

Although all three terms associated with an error signal may be utilized by the PID controller, it is also possible to use only one or two error control terms in order to provide appropriate system control in some scenarios. Such an arrangement may be achieved by setting the other parameters to zero. Accordingly, the PID controller of the present patent disclosure can also be a PI, PD, P or I controller in the absence of the respective control actions. It should be appreciated that a PI controller embodiment may be advantageous where derivative action is sensitive to measurement noise. Regardless of the actual feedback control mechanism used, the thermal control system is operable in "Heating" mode or in "Cooling" mode whereby the thermally controlled plate 308 can be heated or cooled, allowing convenient mounting of example devices in compatible hot melt wax as well as in other mounting techniques for thermal relaxation. It should be further appreciated that given that the spindle head 314 may be adapted to house different types of machining tools, the sample preparation apparatus 300A may be embodied as a digital milling machine, a digital polishing machine or a digital lapping machine, or a combination thereof, depending on the type of machining to be applied to a sample DUT.

Figure 3B:
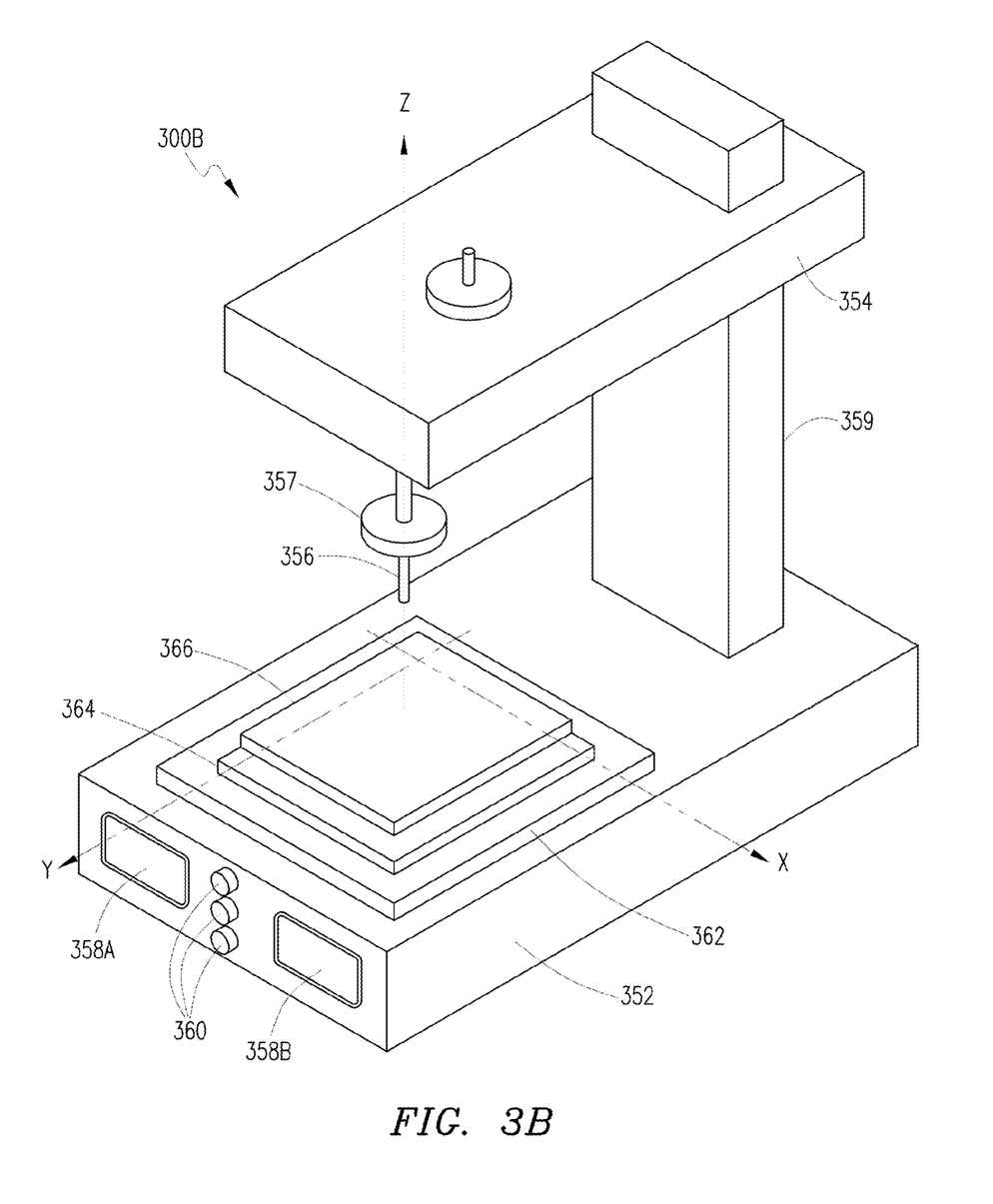
FIG. 3B illustrates a more realistic rendition of an apparatus configured for electronic sample preparation using thermal relaxation techniques and/or 3D curvature correction according to an embodiment of the present disclosure.

FIG. 3B illustrates a more realistic rendition of an apparatus 300B configured for electronic sample preparation using thermal relaxation techniques according to an embodiment of the present disclosure. Consistent with the description set forth hereinabove, the apparatus 300B is illustrative of any known or heretofore unknown digital sample preparation apparatus that includes a thermal control mechanism for providing thermal relaxation to electronic samples in accordance with the teachings herein. In some configurations, the apparatus 300B may be embodied as a retrofitted conventional sample preparation apparatus having a thermal control mechanism of the present patent disclosure.

Similar to the embodiment shown in FIG. 3A, the apparatus 300B includes a base unit or element 352 that houses various pieces of the electronic circuitry (e.g., one or more processors or CPUs, memory, controllers, PID feedback circuitry, control circuitry for controlling Z motion, loading force and spindle speed, electrical interconnect/cabling, etc. as well as persistent/nonvolatile memory for storing program instructions for executing 3D curve-fitting and regression for different packaged parts and for maintaining appropriate 3D surface curves for known or previously curve-fitted packaged parts to be used in initial Z setup) as well as one or more display units, touch screens or GUIs 358A, 358B, along with a plurality of knobs or other manual/analog controls 360. In addition, the base unit 352 may also be configured to operate as an overall load-bearing support member of the apparatus 300B for supporting a vertical/columnar unit 359 as well as various horizontal members, at least some of which are movable in the X and Y directions. For example, reference numeral 362 refers to an X-Y stage similar to the X-Y stage 304 of the embodiment 300A shown in FIG. 3A. Likewise, reference numerals 364 and 366 refer to a grounded base plate and a thermally controlled plate similar to the plates 306 and 308 depicted in FIG. 3A. A machining tool 356 is operably coupled to a chuck or spindle element 357 supported on a head element 354 that is movably engaged relative to the vertical support member 359. As alluded to before, apparatus 300B may be implemented as a CNC machine adapted to control titling of the stage 304 and/or as the spindle element 357 for effectuating 3D curvature compensation while micromachining a part mounted thereon.

Figure 4:
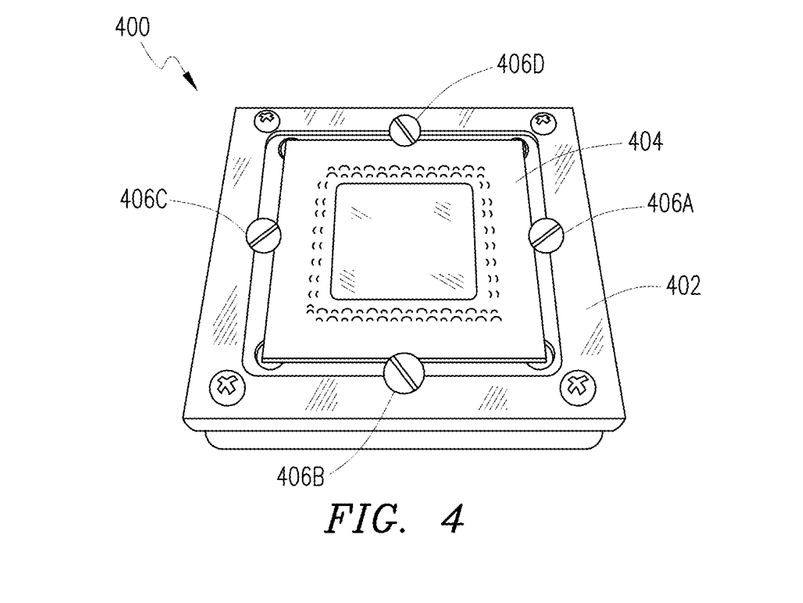
FIG. 4 depicts an example electronic device mount for use with the sample preparation apparatus of FIG. 3B.

FIG. 4 depicts an example mounting 400 wherein an electronic device or DUT 404 is mounted on a thermal plate for use with sample preparation apparatus 300B of FIG. 3B for purposes of the present patent application. Reference numeral 402 refers to a thermally controlled plate whose top planar surface (facing the spindle head, not shown in this FIG.) may be contoured to hold the electronic device 404 that requires micromachining. As will be apparent to one skilled in the art, an example electronic device such as a BGA device may be mounted with the solder ball side facing up, i.e., facing the spindle head, or facing down, i.e., facing the stage, depending on the type of subsequent treatment(s) to be applied to the prepared sample. In the example mounting 400 depicted in FIG. 4, the electronic device 404 is mounted with the solder ball side facing down. A plurality of retaining means 406A-406D made of a material having a relatively low thermal expansion (i.e., a smaller coefficient of thermal expansion) may be used to hold the electronic device 404 snugly in place. For example, nylon screws may be used to mount the electronic device 404 in one example implementation, although various other mechanical means (e.g., flanges, pins, clamps, clips, tabs, tacks, clasps, brackets, grips, locks, snaps, vices, etc.) as well as chemical/mechanical bonding means (e.g., thermally suitable adhesives, pastes, films, glues, soldering, etc.) or both may also be used as retention means in certain applications. In a still further implementation, a separate holder or board designed to hold or otherwise retain the electronic device 404 may be mounted to the thermally controlled plate 402. Additionally, as alluded to previously, although the solder ball side is shown facing down, an example electronic device may be mounted with the die side down as well depending on the machining and/or FA technique(s) to be used.

Figure 5:
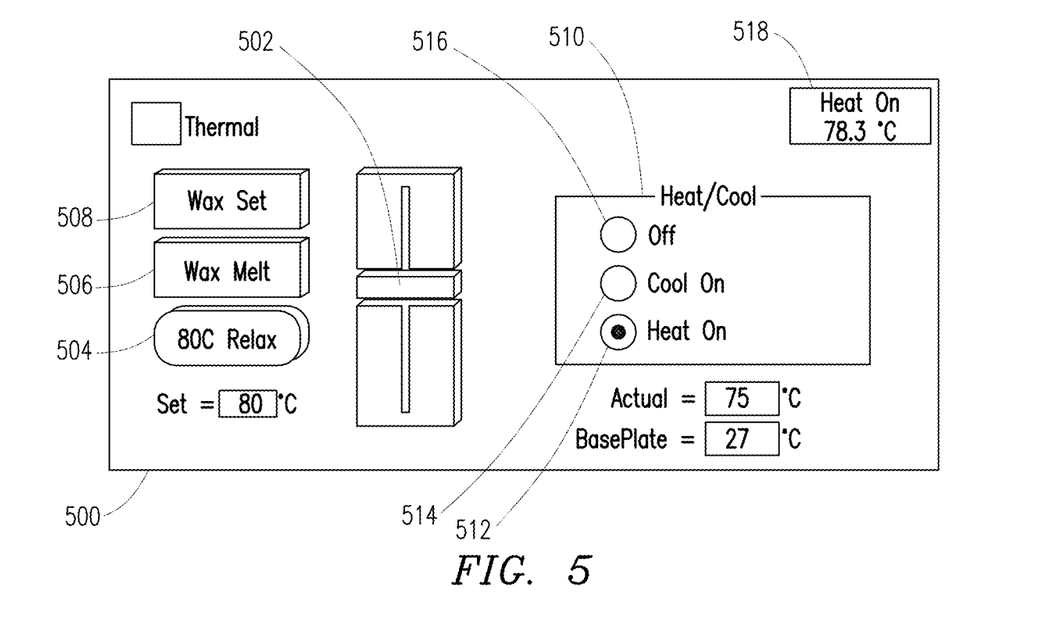
FIG. 5 illustrates a graphic user interface (GUI) or display that may be associated with a sample preparation apparatus for purposes of the present patent application.

FIG. 5 illustrates a graphic user interface (GUI) or display 500 that may be associated with a sample preparation apparatus 300B for purposes of the present patent application. A setpoint slider may be provided that can be moved up and down (i.e., vertically) or sideways (i.e., horizontally) or in any other suitable configuration using a pointing device (e.g., a computer mouse) or a finger (on a touch screen, for example) to select a temperature to be applied and maintained with respect to a thermal relaxation procedure. Reference numeral 502 refers to an example of a vertical slider configuration in one implementation. The GUI display 500 may include a Relaxation Temperature indicator 504 and Wax Melt and Wax Set indicators 506, 508. A Heat/Cool mode selector panel or window 510 allows a user to specify whether a heating cycle or a cooling cycle is to be applied to the DUT by clicking on or otherwise activating appropriate software buttons 512, 514, respectively. An OFF button 516 may be provided to turn off the thermal control when so desired. A Message Center panel 518 may be included to display any system messages or notifications to the user.

One or more experimental setups and the results pertaining thereto will now be described below that highlight example thermal relaxation techniques and 3D surface modeling/correction for sample preparation in accordance with the teachings of the present disclosure. To test the effects of thermal relaxation on a packaged part during and after thinning (i.e., as an example electronic device), BGA parts having semiconductor dies with areas of 20 mm by 20 mm were used in an Ultra Tec Manufacturing's ASAP-1 IPS sample preparation tool. The dies were measured for the warpage (center-to-edge in height (h) measurements) initially without heating (i.e., at normal room or ambient temperature of 25° C.) and then with temperatures maintained at 80° C. and 110° C. The "h" measurements (in μm) were converted into radius of curvature and Diopter measurements that illustrated the effects of thermal relaxation on the parts in a more meaningful way. The following equations were used for the radius of curvature (R) and Diopter (D) calculations:

$$R=(h^2+x^2)/(2h) \text{ (in mm)} \quad \text{(Eqn. 1)}$$

$$D=523/R \text{ (in Diopters)} \quad \text{(Eqn. 2)}$$

where a Diopter is the reciprocal of focal length in meters and is a unit of measurement of the optical power of a lens or a curved mirror and x is the measured distance traversed away from the center (where h is measured) along the X-axis. Crown glass having a Refractive Index of 1.523 may be used as a "flatness" standard in computing the D measurements of the BGA test parts. Additional details regarding the R computation may be found in the paper titled "Stress Reduction during Silicon Thinning Using Thermal Relaxation and 3D Curvature Correction Techniques", *ISTFA* 2012 *Proceedings*, pp. 478-484 (2012), co-authored by the inventor of the instant patent application, which is hereby incorporated by reference herein. Table I below shows the effects of relaxation on the curvatures wherein the BGA parts were mounted with the solder balls facing down (i.e., revealing a convex die surface):

TABLE I

| Parameter | Temp | | |
|---|---|---|---|
| | 25° C. | 80° C. | 110° C. |
| Center-to-Edge height (μm) | 39.15 | 11.73 | 1.24 |
| Radius of Curvature (mm) | 1152.64 | 3848.62 | 36391.13 |
| Diopters (for an Index of 1.523) | 0.45 | 0.14 | 0.01 |

It should be appreciated that having a radius of curvature (R) that is larger implies a more planar surface, assuming a spherical surface model for the die surface. As such, the parts treated with the higher temperatures exhibited more planarity as evidenced by larger radii of curvature, lower center-to-edge height values as well as lower Diopter values.

As an initial test for sample preparation, a BGA part was mounted on the sample preparation tool using a nylon-screw mounting arrangement (such as, e.g., shown in FIG. 4). The test part was thinned down to 500 microns (μm) on the sample preparation tool in increments. The inspection of the sample after a removal of 200 μm of silicon showed that the die cracked at many points, as shown in the priority Provisional Application No. 61/686,871, incorporated by reference herein. It appeared that the initial test part was a high stress device, which cracked almost as soon as the surface was disturbed with the diamond tool at room temperature. To minimize the risk of cracking during the preparation of a test BGA (to be used as a reference), another BGA part was mounted and thinned at 25° C. again but with a controlled force feedback and fast-stepped at 40 nanometers (nm) (thus allowing for a finer removal process). The test part was inspected after a silicon removal of 100 μm, which showed no signs of cracking. After further thinning and polishing down to 120 μm, the center-to-edge variation was measured.

Another sample part was mounted and heated at 80° C. on a thermally controlled plate. After thinning 100 μm at 80° C., the part showed no cracking, further indicating that thermally relaxed part allowed for even more aggressive silicon removal, e.g., within a few minutes. A still further sample part was thinned and polished at 110° C. and examined. Again, no cracks were observed even with aggressive silicon removal. To determine how planar the prepared samples were after thinning and polishing under thermal relaxation, each prepared part was observed under an IR microscope. Using a fringe counting method (i.e., based on counting the fringes in an interference pattern obtained when the IR radiation is applied to a surface), the number of observed fringes was converted to a change in the silicon depth (in μm) using the following formula:

$$[\lambda * OPD]/[2n]=\Delta t \quad \text{(Eqn. 3)}$$

where
  n=Index of Refraction (3.434 for Silicon)
  Δt=Change in silicon depth (in μm)
  λ=Wavelength of the IR used (e.g., 1.064 μm for NIR)
  OPD=Number of observed fringes Plugging in the known constants (n and λ), Eqn. 3 can be simplified as below:

$$0.155*OPD = \Delta t \quad \text{(Eqn. 4)}$$

Additional details regarding the fringe counting method may be found in the paper titled "BGA and Advanced Package Wire to Wire Bonding for Backside Emission Spectroscopy", *ISTFA* 1999 *Proceedings*, pp. 365-374 (1999), authored by the inventor of the instant patent application, which is hereby incorporated by reference herein.

Figure 6A:
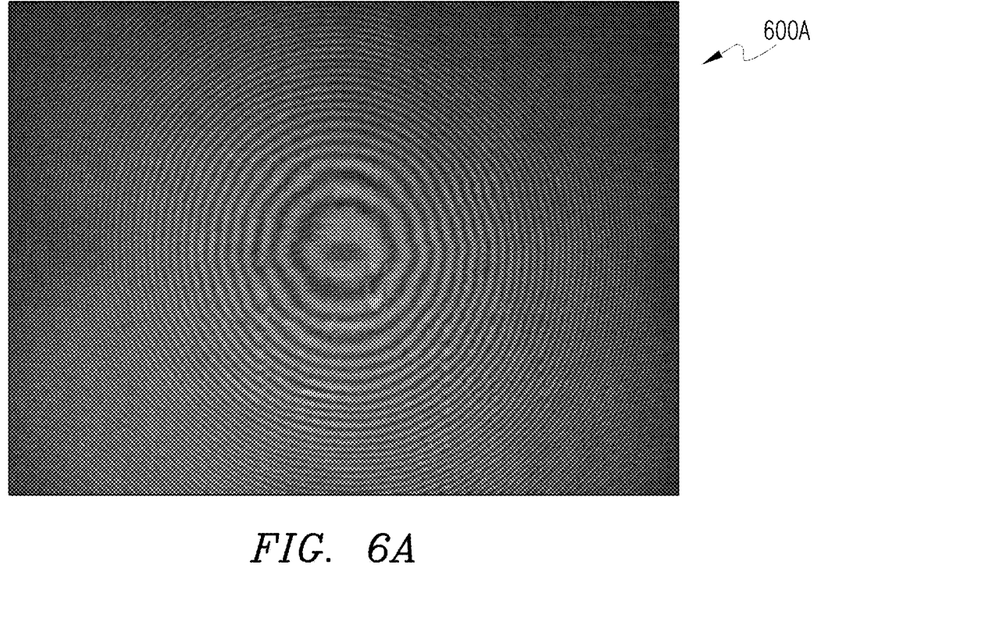
FIGS. 6A-6C are photomicrographs depicting IR interference fringe patterns obtained from example electronic samples that are prepared at multiple temperatures according to the teachings of the present patent application.
Figure 6B:
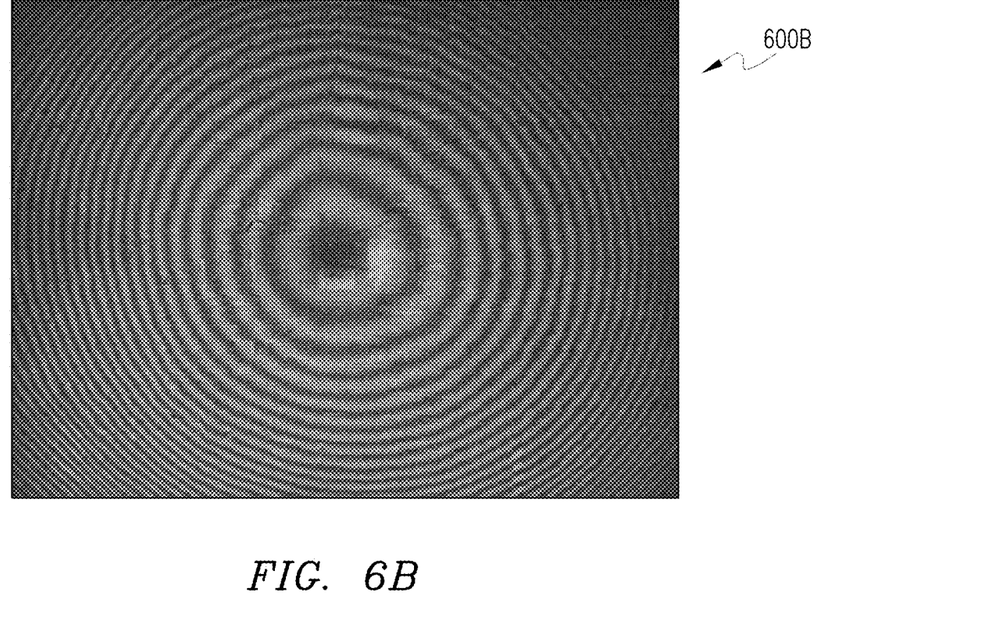
Figure 6C:
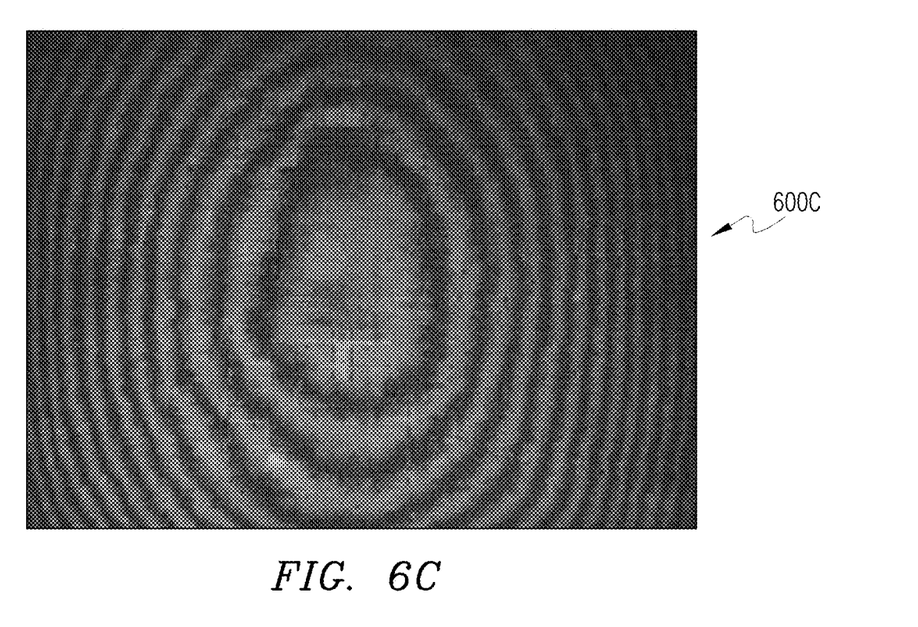

FIGS. 6A-6C depict black and white photomicrographs of the fringe patterns obtained from the sample BGA parts prepared at three different temperatures as described above. Reference numeral 600A refers to the fringe pattern observed on the BGA part prepared at 25° C. Reference numeral 600B refers to the fringe pattern observed on the BGA part prepared at 80° C. Finally, reference numeral 600C refers to the fringe pattern observed on the BGA part prepared at 110° C. As can be readily seen, fewer fringes were obtained with the thermally relaxed parts, thereby indicating more planarity. Table II below shows the results in a tabular form:

TABLE II

| | Sample Prep Temp | | |
|---|---|---|---|
| Parameter | 25° C. | 80° C. | 110° C. |
| Fringe Count (traveling 10 mm from the die center) | 415 | 177 | 75 |
| Radius of Curvature (mm) | 781.28 | 1851.87 | 4166.67 |
| Change in Si depth Δt (in μm) | 64 | 27 | 12 |
| Diopters (for an Index of 1.523) | 0.66 | 0.28 | 0.13 |

One skilled in the art will appreciate that the fringe counts for the BGA parts prepared at 80° C. and 110° C. were 177 and 75, respectively, substantially lower than the count (415) for the reference BGA part prepared at 25° C. The corresponding Δt and radii of curvature also indicate a more planar surfacing obtained at higher temperatures.

Based on the foregoing Detailed Description, it should be appreciated that the present disclosure advantageously provides a scheme for stress reduction during electronic sample preparation using thermal relaxation techniques that may be used in conjunction with 3D curvature correction. Although the disclosure has been described with reference to certain example embodiments, it is to be understood that the embodiments shown and described are to be treated as exemplary embodiments only. For example, whereas a Peltier-based thermal control system is described in detail, other types of thermal sources may be also provided for purposes of the present patent application, including, for instance, IR, laser, or other EM radiation of suitable wavelengths, sonic energies, with appropriate feedback loop control. In addition to any number of micromachining processes, sample preparation techniques may also include physical separation and extraction of the individual semiconductor dies of a packaged part, either in whole or any portion thereof, wherein thermal relaxation may advantageously facilitate such operations. Broadly, the techniques disclosed herein may be practiced where materials of dissimilar thermal properties are brought together, e.g., in a sandwich formation, during manufacturing at temperatures that may cause or create stress/strain conditions in at least one or more layers at normal ambient temperatures.

Accordingly, although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Those skilled in the art will therefore recognize that the exemplary embodiments described herein can be practiced with various modifications, substitutions, alterations and the like within the spirit and scope of the claims appended below.

What is claimed is:

1. A method for preparing electronic devices for analysis, comprising:
   mounting an electronic device on a thermally controlled plate;
   applying a select temperature to the thermally controlled plate, the select temperature being chosen to mitigate non-planar surface conditions associated with one or more dies forming part of the electronic device; and
   while maintaining the select temperature applied to the thermally controlled plate, performing a process on the electronic device to prepare the electronic device for analysis, wherein the process to prepare the electronic device for analysis comprises at least one of grinding, polishing, thinning, milling, lapping and extraction of one or more semiconductor dies forming the electronic device.

2. The method of claim 1, wherein the electronic device is mounted on a board via soldering.

3. The method of claim 1, wherein the electronic device is mounted using a plurality of screws made of material having a low coefficient of thermal expansion.

4. The method of claim 1, wherein the select temperature is selected based on temperatures of the manufacturing process flow of the electronic device.

5. The method of claim 1, wherein the electronic device comprises one of a ball grid array device, a flip-chip device, a multi-chip module device, and a chip scale package device.

6. The method of claim 1, wherein the electronic device comprises at least one semiconductor die that is packaged using an underfill material having a coefficient of thermal expansion that is different from a coefficient of thermal expansion of the semiconductor die's substrate.

7. The method of claim 1, wherein the select temperature is applied using one or more Peltier elements in a stack coupled to the thermally controlled plate.

8. The method of claim 1, wherein the select temperature is maintained using a feedback control.

9. The method of claim 1, wherein the feedback control is applied using a Proportional-Integral-Derivative (PID) controller.

10. The method of claim 1, wherein the sample preparation process is performed while correcting for the electronic device's curvature based on a 3D model of the electronic device's surface.

11. An apparatus for preparing electronic devices for analysis, comprising:
- a thermally controlled plate adapted for supporting an electronic device thereon;
- a controller for maintaining a select temperature applied to the thermally controlled plate; and
- a spindle head for rotating a chuck about a Z-axis that is substantially perpendicular to the thermally controlled plate, the chuck adapted for housing a machining tool configured to perform a process on the electronic device to prepare the electronic device for analysis.

12. The apparatus of claim 11, further comprising a holder for holding the electronic device to be mounted on the thermally controlled plate.

13. The apparatus of claim 11, further comprising means for mounting the electronic device to the thermally controlled plate.

14. The apparatus of claim 11, wherein the means for mounting comprises a plurality of screws made of material having a low coefficient of thermal expansion.

15. The apparatus of claim 11, wherein the machining tool is configured for performing at least one of grinding, polishing, thinning, milling, lapping and extracting of one or more semiconductor dies forming the electronic device.

16. The apparatus of claim 11, further comprising one or more Peltier elements in a stack coupled to the thermally controlled plate for applying the select temperature.

17. The apparatus of claim 11, wherein the controller comprises a Proportional-Integral-Derivative (PID) controller.

18. The apparatus of claim 11, wherein the electronic device comprises one of a ball grid array device, a flip-chip device, a multi-chip module device, and a chip scale package device.

19. The apparatus of claim 11, further comprising a base unit for housing the controller and a graphic user interface (GUI) for selecting temperature control set points.

20. The apparatus of claim 11, further comprising means for compensating for the electronic device's curvature based on a 3D model of the electronic device's surface while performing the sample preparation process.

* * * * *